(12) United States Patent
Takeda

(10) Patent No.: US 12,400,829 B2
(45) Date of Patent: Aug. 26, 2025

(54) PLASMA PROCESSING APPARATUS AND PLASMA PROCESSING METHOD

(71) Applicant: Panasonic Intellectual Property Management Co., Ltd., Kadoma (JP)

(72) Inventor: Naoaki Takeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 276 days.

(21) Appl. No.: 18/336,175

(22) Filed: Jun. 16, 2023

(65) Prior Publication Data

US 2024/0014009 A1 Jan. 11, 2024

(30) Foreign Application Priority Data

Jul. 6, 2022 (JP) .................................. 2022-109154
Jul. 6, 2022 (JP) .................................. 2022-109155

(51) Int. Cl.
*H01J 37/32* (2006.01)

(52) U.S. Cl.
CPC ...... *H01J 37/32183* (2013.01); *H01J 37/321* (2013.01); *H01J 2237/24564* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 6,456,010 B2* | 9/2002 | Yamakoshi | ....... | H01J 37/32165 315/111.21 |
| 6,894,245 B2* | 5/2005 | Hoffman | ........... | H01J 37/32082 315/111.21 |
| 7,132,618 B2* | 11/2006 | Hoffman | ............. | H01J 37/3266 219/121.43 |
| 7,186,943 B2* | 3/2007 | Hoffman | ........... | H01J 37/32183 219/121.36 |
| 12,165,845 B2* | 12/2024 | Okita | ................ | H01J 37/32266 |
| 2001/0021422 A1* | 9/2001 | Yamakoshi | ....... | H01J 37/32082 315/169.3 |
| 2003/0136766 A1* | 7/2003 | Hoffman | ............. | H01J 37/3244 219/121.43 |

(Continued)

FOREIGN PATENT DOCUMENTS

JP 2010-238981 A 10/2010

*Primary Examiner* — Srinivas Sathiraju
(74) *Attorney, Agent, or Firm* — MCDONALD HOPKINS LLC

(57) ABSTRACT

Disclosed is a plasma processing apparatus 10 including: a chamber 11; a high-frequency power source 19 configured to supply a high-frequency power for generating plasma in the chamber 11; a matcher connected to the high-frequency power source 19; a distributor 22 connected to the matcher 21 and configured to distribute and output the high-frequency power supplied from the high-frequency power source 19; a first coil 17 and a second coil 18 connected in parallel with each other, on an output side of the distributor 22; and a control unit 35 configured to change a distribution ratio of the high-frequency power distributed between the first coil 17 and the second coil 18. The control unit 35 changes the distribution ratio after a reflected wave power in the matcher 21 is made equal to or less than a first threshold by the matcher 21.

17 Claims, 10 Drawing Sheets

(56) References Cited

U.S. PATENT DOCUMENTS

| | | | |
|---|---|---|---|
| 2004/0211759 A1* | 10/2004 | Hoffman | H01J 37/32082 219/121.4 |
| 2010/0243162 A1* | 9/2010 | Koshimizu | H01J 37/32935 156/345.46 |
| 2020/0273712 A1* | 8/2020 | Uto | H01L 21/31116 |
| 2023/0170186 A1* | 6/2023 | Okita | H01J 37/3211 315/111.21 |
| 2024/0014009 A1* | 1/2024 | Takeda | H01J 37/321 |

* cited by examiner

PLASMA PROCESSING APPARATUS AND PLASMA PROCESSING METHOD

CROSS REFERENCE TO RELATED APPLICATION

The present application is based on and claims priority under 35 U.S.C. § 119 with respect to the Japanese Patent Application Nos. 2022-109154 and 2022-109155 both filed on Jul. 6, 2022, of which entire content is incorporated herein by reference into the present application.

TECHNICAL FIELD

The present disclosure relates to a plasma processing apparatus and a plasma processing method.

BACKGROUND OF THE INVENTION

Conventionally, a plasma processing apparatus for performing plasma processing on an object to be processed has been known as disclosed in Patent Literature 1 (JP2010-238981A). The plasma processing apparatus of Patent Literature 1 includes a chamber, a plurality of coils configured to, when applied with a high-frequency power, generate plasma in the chamber, a power dividing unit configured to divide and supply the high-frequency power to each coil, and a control device configured to control the power ratio divided in the power dividing unit. The control device has a memory, and according to a recipe stored in advance in the memory, controls the power ratio divided in the power dividing unit.

However, when controlling the ratio of the high-frequency powers supplied to respective coils, there is a risk that, depending on the control mode of the power dividing unit, the plasma discharge generated in the chamber cannot be maintained, and the plasma may extinguish (misfire). A plasma misfire is highly likely to occur especially when the impedance (load impedance) at downstream of the power dividing unit fluctuates a lot. Under such circumstances, one object of the present disclosure is to suppress a plasma misfire.

SUMMARY OF THE INVENTION

One aspect of the present disclosure relates to a plasma processing apparatus. The plasma processing apparatus includes: a chamber; a high-frequency power source configured to supply a high-frequency power for generating plasma in the chamber; a matcher connected to the high-frequency power source; a distributor connected to the matcher and configured to distribute and output the high-frequency power supplied from the high-frequency power source; a first coil and a second coil connected in parallel with each other, on an output side of the distributor; and a control unit configured to change a distribution ratio of the high-frequency power distributed between the first coil and the second coil, wherein the control unit changes the distribution ratio after a reflected wave power in the matcher is made equal to or less than a first threshold by the matcher.

Another aspect of the present disclosure relates to a plasma processing method. The plasma processing method uses a plasma processing apparatus including a chamber, a high-frequency power source configured to supply a high-frequency power for generating plasma in the chamber, a matcher connected to the high-frequency power source, a distributor connected to the matcher and configured to distribute and output the high-frequency power supplied from the high-frequency power source, and a first coil and a second coil connected in parallel with each other, on an output side of the distributor, the method including: a first process of making a reflected wave power in the matcher to be equal to or less than a first threshold by the matcher; and a second process of, after the first process, changing a distribution ratio of the high-frequency power distributed between the first coil and the second coil.

One aspect of the present disclosure relates to a plasma processing apparatus. The plasma processing apparatus includes: a chamber; a high-frequency power source configured to supply a high-frequency power for generating plasma in the chamber; a matcher connected to the high-frequency power source; a distributor connected to the matcher and having a first variable capacitor and a second variable capacitor, and configured to distribute and output the high-frequency power supplied from the high-frequency power source; a first coil and a second coil connected in parallel with each other, on an output side of the distributor; a control unit configured to control a distribution ratio of the high-frequency power distributed between the first coil and the second coil, based on a distribution ratio information indicating a relationship between the distribution ratio and the capacitance values of the first variable capacitor and the second variable capacitor, by adjusting at least one of the capacitance values of the first variable capacitor and the second variable capacitor; and an update unit configured to update the distribution ratio information, based on the high-frequency powers outputted to the first coil and the second coil.

Another aspect of the present disclosure relates to a plasma processing method. The plasma processing method uses a plasma processing apparatus including a chamber, a high-frequency power source configured to supply a high-frequency power for generating plasma in the chamber, a matcher connected to the high-frequency power source, a distributor connected to the matcher and having a first variable capacitor and a second variable capacitor, and configured to distribute and output the high-frequency power supplied from the high-frequency power source, and a first coil and a second coil connected in parallel with each other, on an output side of the distributor, the method including: a third process of controlling a distribution ratio of the high-frequency power distributed between the first coil and the second coil, based on a distribution ratio information indicating a relationship between the distribution ratio and the capacitance values of the first variable capacitor and the second variable capacitor, by adjusting at least one of the capacitance values of the first variable capacitor and the second variable capacitor; and a fourth process of updating the distribution ratio information, based on the high-frequency powers outputted to the first coil and the second coil.

According to the present disclosure, a plasma misfire can be suppressed. Furthermore, according to the present disclosure, electric power can be appropriately supplied to a plurality of coils in a desired distribution ratio therebetween.

DETAILED DESCRIPTION OF THE INVENTION

Figure 1:
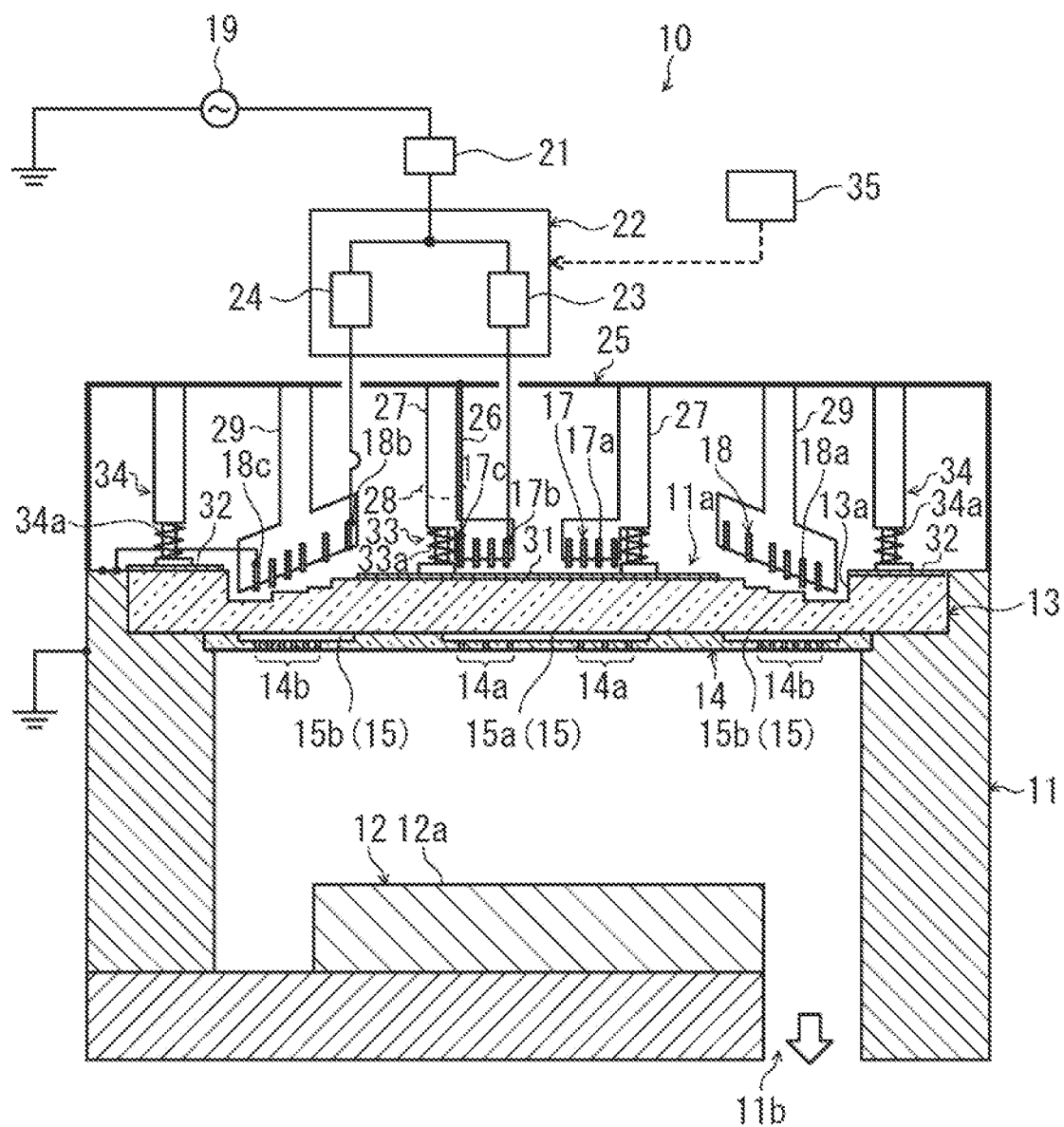
FIG. 1 is a schematic cross-sectional view of a plasma processing apparatus according to Embodiments 1 and 2.

Embodiments of a plasma processing apparatus and a plasma processing method according to the present disclosure will be described below by way of examples. It is to be noted, however, that the present disclosure is not limited to the examples described below. In the description below, specific numerical values and materials are exemplified in some cases, but other numerical values and materials may be applied as long as the effects of the present disclosure can be achieved.

(Plasma processing apparatus A)

A plasma processing apparatus according to one embodiment of the present disclosure (hereinafter sometimes referred to as a plasma processing apparatus A) is for performing plasma processing on an object to be processed. The plasma processing apparatus A may be, for example, a plasma etching apparatus, a plasma dicer, a plasma ashing apparatus, or a plasma CVD apparatus. The plasma processing apparatus A includes a chamber, a high-frequency power source, a matcher, a distributor, a first and a second coil, and a control unit.

The chamber may be formed in a hollow cylindrical shape. The chamber may have an opening at the top. The opening may open upward. A dielectric member may be provided at the opening. The chamber may be grounded.

The high-frequency power source supplies a high-frequency power for generating plasma in the chamber. The frequency of the high-frequency power may be, for example, 3 MHz or more and 30 MHz or less.

The matcher is connected to the high-frequency power source. The matcher is configured to perform matching of the impedance (input impedance) of the high-frequency power source to the impedance (load impedance) at downstream of the matcher. The matcher may have at least one variable capacitor, and may perform impedance matching by changing the capacitance value of the at least one variable capacitor. The matcher may be an automatic matcher capable of automatically performing impedance matching.

The distributor is connected to the matcher. The distributor distributes and outputs the high-frequency power supplied from the high-frequency power source. The distributor may have an input section connected to the matcher, and a first and a second output section. The distributor may distribute and output the high-frequency power inputted to the input section, from the first and the second output section. The distributor may have at least one variable capacitor, and may be configured to change the distribution ratio of the high-frequency power by changing the capacitance value of the at least one variable capacitor.

The first coil and the second coil are connected in parallel with each other on an output side of the distributor. The first coil may be connected to the first output section of the distributor. The second coil may be connected to the second output section of the distributor. The first coil and the second coil may be positioned above the chamber. By applying a high-frequency power to the first coil and the second coil, a plasma for processing an object to be processed can be generated in the chamber. The first coil and the second coil may be each configured in a helical or spiral shape. The first coil and the second coil each having a helical or spiral shape may be arranged coaxially with each other.

The control unit changes the distribution ratio of the high-frequency power distributed between the first coil and the second coil. The control unit may change the distribution ratio through controlling of the distributor, specifically through adjusting of an electronic component (e.g., variable capacitor) included in the distributor. The control unit may have an arithmetic device and a storage device for storing a program executable by the arithmetic device. The control unit may be of an integrated type or a remote control type.

The control unit changes the distribution ratio, after the reflected wave power in the matcher is made equal to or less than a first threshold by the matcher. Here, if the reflected wave power in the matcher is large, this means that the high-frequency power from the high-frequency power source is not sufficiently transmitted to the first and second coils. Changing the distribution ratio in such a state involves a risk that the reflected wave power may further increase due to fluctuations of the impedance at downstream of the matcher, which may cause a plasma misfire. On the other hand, the control unit of the present disclosure changes the distribution ratio, after the reflected wave power in the matcher is made equal to or less than the first threshold. That is, the distribution ratio is changed in a state where the high-frequency power from the high-frequency power source is sufficiently transmitted to the first and second coils. Therefore, a plasma misfire is unlikely to occur even though there is a somewhat increase in the reflected wave power.

Here, the first threshold may be a predetermined threshold corresponding to the ratio of the reflected wave power to the high-frequency power outputted by the high-frequency power source. For example, supposing that the first threshold is set to 1%, when the high-frequency power is 1000 W, the changing of the distribution ratio by the control unit is performed after the reflected wave power becomes 10 W or less. The first threshold may be set, for example, to 5% or less. The first threshold may be set as a predetermined absolute value (e.g., 10 W).

The distributor may have a first variable capacitor and a second variable capacitor. The control unit may change the distribution ratio by performing at least one of a first step of changing the capacitance value of the first variable capacitor without changing the capacitance value of the second variable capacitor, and a second step of changing the capacitance value of the second variable capacitor without changing the capacitance value of the first variable capacitor. That is, the distribution ratio may be changed by either of the followings: performing only the first step; performing only the second step; performing the first step, and then performing the second step; and performing the second step, and then performing the first step. Note that, however, that the changing of the capacitance value of the first variable capacitor and the changing of the capacitance value of the second variable capacitor are not performed simultaneously. Here, when an attempt is made to change the capacitance values of a plurality of variable capacitors simultaneously, there may be multiple set points for the desired distribution ratio, and under such situation, it is difficult to uniquely determine the capacitance value of each variable capacitor. On the other hand, according to this configuration, since the capacitance values of the first variable capacitor and the second variable capacitor are not changed simultaneously, the above problem is unlikely to occur, and the capacitance value of each variable capacitor can be uniquely determined easily.

In the present specification, that the capacitance value of the variable capacitor is not changed means that the capacitance value of the variable capacitor is substantially fixed. Specifically, when minor variations in the capacitance value as small as 3% or less of the maximum capacitance of the variable capacitor occur, this is regarded as the capacitance value of the variable capacitor being substantially fixed.

The control unit may perform, when changing the distribution ratio, at least one of the first step and the second step a plurality of times. For example, both the first step and the second step may be performed a plurality of times. According to this configuration, the fluctuations of the impedance at downstream of the matcher are suppressed, and a plasma misfire can be further suppressed.

The control unit may change the distribution ratio by changing the capacitance value of the first variable capacitor and the capacitance value of the second variable capacitor, such that the amount of change per unit time of the capacitance value of the first variable capacitor becomes equal to or less than a second threshold and the amount of change per unit time of the capacitance value of the second variable capacitor becomes equal to or less than a third threshold. According to this configuration, the fluctuations of the impedance at downstream of the matcher is suppressed, and a plasma misfire can be further suppressed. The second threshold and the third threshold may be different from or the same as each other. The second threshold and the third threshold may be each set as a predetermined absolute value.

The control unit may change the distribution ratio such that the amount of change per unit time of the impedance at downstream of the matcher becomes equal to or less than a fourth threshold. The impedance at downstream of the matcher includes not only the impedances of each coil and the distributor that distributes the high-frequency power to each coil, but also the impedance of the plasma (inductively coupled with each coil) for plasma processing. According to this configuration, the fluctuations of the impedance at downstream of the matcher are suppressed, and a plasma misfire can be further suppressed. The fourth threshold may be set as a predetermined absolute value.

(Plasma Processing Method A)

A plasma processing method according to an embodiment of the present disclosure (plasma processing method A) is a plasma processing method using, for example, the above-described plasma processing apparatus A, and includes a first process and a second process.

In the first process, the reflected wave power in the matcher is made equal to or less than the first threshold by the matcher. When the matcher is constituted of an automatic matcher, the first process may be automatically performed by the matcher. The first threshold may be a predetermined threshold corresponding to the ratio of the reflected wave power to the high-frequency power outputted by the high-frequency power source. For example, supposing that the first threshold is set to 1%, when the high-frequency power is 1000 W, the distribution ratio is changed by the control unit after the reflected wave power becomes 10 W or less. The first threshold may be set, for example, to 5% or less. The first threshold may be set as a predetermined absolute value (e.g., 10 W).

In the second process, after the first process, the distribution ratio of the high-frequency power to the first coil and the second coil is changed. Here, if the reflected wave power in the matcher is large, this means that the high-frequency power from the high-frequency power source is not sufficiently transmitted to the first and second coils. Changing the distribution ratio in such a state involves a risk that the reflected wave power may further increase due to fluctuations of the impedance at downstream of the matcher, which may cause a plasma misfire. To address this, in the second process, the distribution ratio is changed after the first process, that is, after the reflected wave power in the matcher is made equal to or less than the first threshold. That is, the distribution ratio is changed in a state where the high-frequency power from the high-frequency power source is sufficiently transmitted to the first and second coils. Therefore, a plasma misfire is unlikely to occur even though there is a somewhat increase in the reflected wave power.

The distributor may have a first variable capacitor and a second variable capacitor. The second process may have at least one of a first step of changing the capacitance value of the first variable capacitor without changing the capacitance value of the second variable capacitor, and a second step of changing the capacitance value of the second variable capacitor without changing the capacitance value of the first variable capacitor. That is, the second process may have either of the followings: only the first step; only the second step; the first step, followed by the second step; and the second step, followed by the first step. Note that, however, that in the second process, the changing of the capacitance value of the first variable capacitor and the changing of the capacitance value of the second variable capacitor are not performed simultaneously. As mentioned above, when an attempt is made to change the capacitance values of a plurality of variable capacitors simultaneously, there may be multiple set points for the desired distribution ratio, and under such situation, it is difficult to uniquely determine the capacitance value of each variable capacitor. On the other hand, according to this configuration, since the capacitance values of the first variable capacitor and the second variable capacitor are not changed simultaneously, the above problem is unlikely to occur, and the capacitance value of each variable capacitor can be uniquely determined easily.

In the second step, at least one of the first step and the second step may be performed a plurality of times. For example, both the first step and the second step may be performed a plurality of times. According to this configuration, the fluctuations of the impedance at downstream of the matcher are suppressed, and a plasma misfire of can be further suppressed.

In the second process, the distribution ratio may be changed by changing the capacitance value of the first variable capacitor and the capacitance value of the second variable capacitor, such that the amount of change per unit time of the capacitance value of the first variable capacitor becomes equal to or less than a second threshold and the amount of change per unit time of the capacitance value of the second variable capacitor becomes equal to or less than a third threshold. According to this configuration, the fluctuations of the impedance at downstream of the matcher is suppressed, and the plasma misfire can be further suppressed. The second threshold and the third threshold may be different from or the same as each other. The second threshold and the third threshold may be each set as a predetermined absolute value.

In the second process, the distribution ratio may be changed such that the amount of change per unit time of the impedance at downstream of the matcher becomes equal to or less than a fourth threshold. The impedance at downstream of the matcher includes not only the impedances of each coil and the distributor that distributes the high-frequency power to each coil, but also the impedance of the plasma (inductively coupled with each coil) for plasma processing. According to this configuration, the fluctuations of the impedance at downstream of the matcher are suppressed, and a plasma misfire can be further suppressed. The fourth threshold may be set as a predetermined absolute value.

(Plasma Processing Apparatus B)

A plasma processing apparatus according to another embodiment of the present disclosure (hereinafter sometimes referred to as a plasma processing apparatus B) is for performing plasma processing on an object to be processed. The plasma processing apparatus B may be, for example, a plasma etching apparatus, a plasma dicer, a plasma ashing apparatus, or a plasma CVD apparatus. The plasma processing apparatus B includes a chamber, a high-frequency power source, a matcher, a distributor, a first and a second coil, a control unit, and an update unit.

The chamber may be similar to that of the plasma processing apparatus A.

The high-frequency power source may be similar to that of the plasma processing apparatus A.

The matcher may be similar to that of the plasma processing apparatus A.

The distributor is connected to the matcher and has a first variable capacitor and a second variable capacitor. The distributor distributes and outputs the high-frequency power supplied from the high-frequency power source. The distributor may have an input section connected to the matcher, and a first and a second output section. The distributor may distribute and output the high-frequency power inputted to the input section, from the first and the second output section. It may be configured such that the distribution ratio of the high-frequency power is changed by changing the capacitance values of the first variable capacitor and the second variable capacitor.

The first coil and the second coil may be similar to those of the plasma processing apparatus A.

The control unit controls the distribution ratio of the high-frequency power distributed between the first coil and the second coil. The control unit controls the distribution ratio, based on a distribution ratio information indicating the relationship between the distribution ratio and the capacitance values of the first variable capacitor and the second variable capacitor, by adjusting at least one of the capacitance values of the first variable capacitor and the second variable capacitor. The distribution ratio information may be stored in a storage unit included in the plasma processing apparatus B, or may be stored in a storage unit included in an apparatus (e.g., a server) separate from the plasma processing apparatus B. The distribution ratio information may be a table-form information indicating the relationship between the capacitance values of the first and second variable capacitors and the distribution ratio. The control unit may have an arithmetic device and a storage device for storing a program executable by the arithmetic device. The control unit may be of an integrated type or a remote control type.

The update unit updates the distribution ratio information, based on the high-frequency powers outputted to the first coil and the second coil. For example, the update unit may update the distribution ratio information, based on the ratio between the high-frequency powers outputted to the first coil and the second coil (i.e., the actual distribution ratio obtained by the control based on the distribution ratio information). With such an update unit, for example, even when a reaction product produced by plasma processing has deposited in the chamber, or one or some parts of the apparatus have worn out, the distribution ratio information can be updated so as to realize a desired distribution ratio, depending on the state of the apparatus. Thus, the high-frequency power can be appropriately supplied to the first coil and the second coil in a desired distribution ratio therebetween. The update unit may be integrated with or separate from the control unit.

The plasma processing apparatus B may further include a first sensor for measuring a high-frequency power outputted to the first coil, a second sensor for measuring a high-frequency power outputted to the second coil, and a calculation unit for calculating an actual distribution ratio, based on the measured values of the first sensor and the second sensor. The update unit may update the distribution ratio information, based on the actual distribution ratio and on the capacitance values of the first variable capacitor and the second variable capacitor when the measured values corresponding to the actual distribution ratio are measured (hereinafter sometimes referred to as the capacitance values at the time of measurement). The first sensor may be disposed between the distributor and the first coil. The second sensor may be disposed between the distributor and the second coil. The calculation unit may be integrated with or separate from the control unit. The distribution ratio information includes an information on the distribution ratio (i.e., assumed distribution ratio) corresponding to the capacitance values at the time of measurement. The update unit may update the distribution ratio information such that the difference between the assumed distribution ratio and the actual distribution ratio is reduced. For example, the update unit may update the distribution ratio information by rewriting the information on the assumed distribution ratio included in the distribution ratio information, to an information on the actual distribution ratio.

The update unit may update the distribution ratio information at the time when the difference between the actual distribution ratio corresponding to randomly selected capacitance values of the first variable capacitor and the second variable capacitor, and the distribution ratio in the distribution ratio information before updating corresponding to the randomly selected capacitance values exceeds a fifth threshold. For example, in such a case, the update unit updates the distribution ratio information by rewriting the information on the distribution ratio in the distribution ratio information before updating, to an information on the actual distribution ratio corresponding to the randomly selected capacitance values. The fifth threshold may be set as a relative ratio to the actual distribution ratio or assumed distribution ratio, or may be set as a predetermined absolute value.

The plasma processing apparatus B may further include a storage unit for storing the distribution ratio information. Alternatively, such a storage unit may be included in an apparatus (e.g., a server) separate from the plasma processing apparatus B.

The update unit may update the distribution ratio information in real time during plasma processing of an object to be processed. Alternatively, the update unit may collectively update the distribution ratio information for multiple combination settings of the capacitance values of the first and second variable capacitors. The latter collective update is especially effective, for example, when newly introducing the plasma processing apparatus B or when replacing consumable parts of the plasma processing apparatus B.

(Plasma Processing Method B)

A plasma processing method according to another embodiment of the present disclosure (plasma processing method B) is a plasma processing method using, for example, the above-described plasma processing apparatus B, and includes a third process and a fourth process.

In the third process, the distribution ratio of the high-frequency power distributed between the first coil and the second coil is controlled. In the third process, the distribution ratio is controlled, based on a distribution ratio information indicating the relationship between the distribution ratio and the capacitance values of the first variable capacitor and the second variable capacitor, by adjusting at least one of the capacitance values of the first variable capacitor and the second variable capacitor.

In the fourth process, the distribution ratio information is updated, based on the high-frequency powers outputted to the first coil and the second coil. For example, in the fourth process, the distribution ratio information may be updated, based on the ratio between the high-frequency powers outputted to the first coil and the second coil (i.e., the actual distribution ratio obtained by the control based on the distribution ratio information). According to such a fourth process, similar to the above, the high-frequency power can be appropriately supplied to the first coil and the second coil in a desired distribution ratio therebetween.

The plasma processing method may further include a fifth process of measuring a high-frequency power outputted to each of the first coil and the second coil, and a sixth process of calculating an actual distribution ratio, based on the measured values in the fifth process. In the fourth step, the distribution ratio information may be updated, based on the actual distribution ratio and on the capacitance values of the first variable capacitor and the second variable capacitor when the measured values corresponding to the actual distribution ratio are measured (i.e., the capacitance values as the time of measurement). Here, the distribution ratio information includes an information on the aforementioned assumed distribution ratio. In the fourth process, the distribution ratio information may be updated such that the difference between the assumed distribution ratio and the actual distribution ratio is reduced. For example, in the fourth process, the distribution ratio information may be updated by rewriting the information on the assumed distribution ratio included in the distribution ratio information, to an information on the actual distribution ratio.

In the fourth process, the distribution ratio information may be updated at the time when the difference between the actual distribution ratio corresponding to randomly selected capacitance values of the first variable capacitor and the second variable capacitor, and the distribution ratio in the distribution ratio information before updating corresponding to the randomly selected capacitance values exceeds a fifth threshold. For example, in such a case, in the fourth process, the distribution ratio information may be updated by rewriting the information on the distribution ratio in the distribution ratio information before updating, to an information on the actual distribution ratio corresponding to the randomly selected capacitance values.

In the fourth process, the distribution ratio information may be updated in real time during plasma processing of an object to be processed. Alternatively, in the fourth process, the distribution ratio information may be collectively updated for multiple combination settings of the capacitance values of the first and second variable capacitors.

As described above, according to the present disclosure, a plasma misfire during plasma processing can be suppressed. Furthermore, according to the present disclosure, by updating the distribution ratio information as appropriate, the high-frequency power can be appropriately supplied to the first and second coils in a desired distribution ratio therebetween.

In the following, examples of the plasma processing apparatus and method according to the present disclosure will be specifically described with reference to the drawings. The components and processes as described above can be applied to the components and processes of the below-described examples of the plasma processing apparatus and method. The components and processes of the below-described examples of the plasma processing apparatus and method can be modified based on the description above. The matters as described below may be applied to the above embodiments. Of the components and processes of the below-described examples of the plasma processing apparatus and method, the components and processes which are not essential to the plasma processing apparatus and method according to the present disclosure may be omitted. The figures below are schematic and not intended to accurately reflect the shape and the number of the actual members.

Embodiment 1

Figure 2:
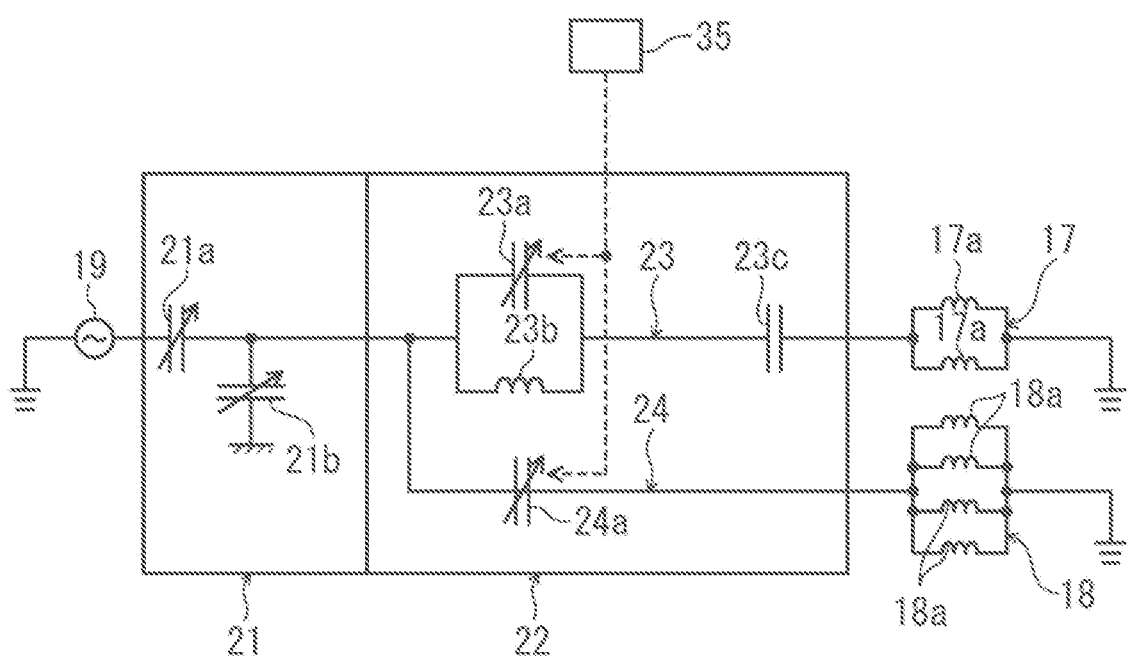
FIG. 2 is a schematic circuit diagram showing a configuration from a high-frequency power source to first and second coils.

Embodiment 1 of the present disclosure will be described. A plasma processing apparatus 10 of the present embodiment is for performing plasma processing on an object to be processed (e.g., a semiconductor substrate). The plasma processing apparatus 10 of the present embodiment is a plasma dicer, but is not limited thereto. As illustrated in FIGS. 1 and 2, the plasma processing apparatus 10 includes a chamber 11, a stage 12, a dielectric member 13, a cover 14, a gas introduction path 15, a first coil 17 and a second coil 18, a metal cover 25, a first support post 27, a second support post 29, a first heater 31 and a second heater 32, a first pressing part 33 and a second pressing part 34, a high-frequency power source 19, a matcher 21, a distributor 22, and a control unit 35.

The chamber 11 has an opening 11a at the top. The chamber 11 is formed in a hollow cylindrical shape, but is not limited thereto. The opening 11a is open upward. The chamber 11 is arranged circumferentially outward from the stage 12, and has an exhaust port 11b for exhausting the source gas used for plasma processing. An exhaust device (not shown) is connected to the exhaust port 11b. The chamber 11 is constituted of a conductive member (e.g., metal). The chamber 11 is grounded.

The stage 12 is installed within the chamber 11, and an object to be processed is placed thereon. The stage 12 has a horizontal placement surface 12a for placing an object to be processed is placed. The stage 12 has a channel (not shown) for a coolant for cooling an object to be processed to flow therethrough during plasma processing. The stage 12 has an electrostatic chuck system (not shown) for chucking an object to be processed. The stage 12 has a lower electrode (not shown) to be applied with a high-frequency power.

The dielectric member 13 closes the opening 11a of the chamber 11. The dielectric member 13 is formed in a plate shape having a horizontally extending region. The dielectric member 13 is constituted of, for example, quartz, but is not limited thereto.

The cover 14 is installed so as to cover the dielectric member 13 inside the chamber 11. The cover 14 covers the lower surface of the dielectric member 13. The cover 14 includes a plurality of first gas holes 14a formed at positions overlapping a central region of the dielectric member 13, a plurality of second gas holes 14b formed at positions overlapping a peripheral region of the dielectric member 13. The first gas holes 14a and the second gas holes 14b pierce the cover 14 in the thickness direction (vertical direction in FIG. 1). The first gas holes 14a and the second gas holes 14b communicate with the space in the chamber 11 where the stage 12 is installed. The plurality of the first gas holes 14a are provided at intervals in the radial direction and in the circumferential direction. The plurality of the second gas holes 14b are provided at intervals in the radial direction and in the circumferential direction. The cover 14 is constituted of, for example, aluminum nitride, but is not limited thereto.

The gas introduction path 15 is formed between the dielectric member 13 and the cover 14, and a source gas is introduced therethrough. The gas introduction path 15 has a first gas introduction path 15a communicating with the first gas holes 14a and a second gas introduction path 15b communicating with the second gas holes 14b. The first gas introduction path 15a and the second gas introduction path 15b are each constituted of a groove formed in the cover 14. The first gas introduction path 15a and the second gas introduction path 15b are separate from each other. The first gas introduction path 15a and the second gas introduction path 15b each communicate with outside the chamber 11. A gas source (not shown) is connected to each of the first and second gas introduction paths 15a and 15b.

The first coil 17 and the second coil 18 are connected in parallel with each other on an output side of the distributor 22. The first coil 17 includes a plurality of (two, in this example) first conductors 17a connected in parallel with each other. The second coil 18 is arranged so as to surround the first coil 17. The second coil 18 includes a plurality (four, in this example) of second conductors 18a connected in parallel with each other.

One ends (first ends 17b) of the first conductors 17a constituting the first coil 17 are connected to, via the distributor 22 and the matcher 21, to the high-frequency power source 19. The other ends (second ends 17c) of the first conductors 17a constituting the first coil 17 are grounded via the chamber 11 which is electrically conductive. One ends (third ends 18b) of the second conductors 18a constituting the second coil 18 are connected, via the distributor 22 and the matcher 21, to the high-frequency power source 19. The other ends (fourth ends 18c) of the second conductors 18a constituting the second coil 18 are grounded via the chamber 11 which is electrically conductive.

The metal cover 25 covers the first coil 17 and the second coil 18. The metal cover 25 is disposed on the upper side of the chamber 11 and electrically connected to the chamber 11. The metal cover 25 is formed in a cylindrical shape with a closed upper end, but is not limited thereto. The metal cover 25 may be constituted of, for example, aluminum.

The first support post 27 is installed above the central region of the dielectric member 13. The first support post 27 is constituted of an electrical insulator. The first support post 27 is supported by the metal cover 25. The first support post 27 supports the first coil 17. The first support post 27 supports a conductive member 26 connected to the second end 17c of the first coil 17 via a fixing member 28. The conductive member 26 is electrically connected to the metal cover 25, above the first coil 17. The conductive member 26 does not extend into a region above the second coil 18.

The second support post 29 is installed above the peripheral region of the dielectric member 13. The second support post 29 is constituted of an electrical insulator. The second support post 29 is supported by the metal cover 25. The second support post 29 supports the second coil 18.

The first heater 31 and the second heater 32 are provided on the upper surface of the dielectric member 13, and applies heat to the dielectric member 13 during plasma processing. The first heater 31 is provided closer to the center than the second heater 32.

The first pressing part 33 and the second pressing part 34 press the first heater 31 and the second heater 32 against the dielectric member 13. The first pressing part 33 is provided between the first support post 27 and the first heater 31. The first pressing part 33 has a first spring 33a for pressing the first heater 31 against the dielectric member 13. The second pressing part 34 is provided between the metal cover 25 and the second heater 32. The second pressing part 34 has a second spring 34a for pressing the second heater 32 against the dielectric member 13.

The high-frequency power source 19 supplies a high-frequency power (e.g., AC power of 3 to 30 MHz) for generating plasma in the chamber 11. The high-frequency power source 19 is connected, via the matcher 21 and the distributor 22, to the first ends 17b of the first coil 17 and the third ends 18b of the second coil 18.

The matcher 21 is connected to the high-frequency power source 19. The matcher 21 has a third variable capacitor 21a connected in series with the high-frequency power source 19 and a fourth variable capacitor 21b connected in parallel with the high-frequency power source 19. The matcher 21 is configured to perform matching of the impedance (input impedance) of the high-frequency power source 19 to the impedance (load impedance) at downstream of the matcher 21, by adjusting the capacitance value of each of the third variable capacitor 21a and the fourth variable capacitor 21b.

The distributor 22 is connected to the matcher 21. The distributor 22 includes a first distributing circuit 23 for distributing part of the high-frequency power outputted from the high-frequency power source 19 to the first coil 17, and a second distributing circuit 24 for distributing part of the above high-frequency power to the second coil 18. The first distributing circuit 23 has a first variable capacitor 23a and an inductor 23b connected in parallel with each other, and a capacitor 23c connected in series to the both on their downstream side. The second distributing circuit 24 is constituted only of a second variable capacitor 24a. The first distributing circuit 23 and the second distributing circuit 24 are connected in parallel with each other.

The control unit 35 changes the distribution ratio of the high-frequency power distributed between the first coil 17 and the second coil 18. The control unit 35 changes the distribution ratio through controlling of the distributor 22, specifically through adjusting of the capacitance values of the first and second variable capacitors 23a and 24a included in the distributor 22. The control unit 35 changes the distribution ratio after the reflected wave power in the matcher 21 is made equal to or less than a first threshold by the matcher 21.

The control unit 35 changes the distribution ratio by performing at least one of a first step and a second step. In the first step, the control unit 35 changes the capacitance value of the first variable capacitor 23a without changing the capacitance value of the second variable capacitor 24a. In the second step, the control unit 35 changes the capacitance value of the second variable capacitor without changing the capacitance value of the first variable capacitor 23a.

The control unit 35 changes the distribution ratios such that the amount of change per unit time of the impedance at downstream of the matcher 21 becomes equal to or less than a fourth threshold. As a specific example, the control unit 35, in the first step, changes the capacitance value of the first variable capacitor 23a such that the amount of change per unit time of the capacitance value of the first variable capacitor 23a becomes equal to or less than a second threshold, and in the second step, changes the capacitance value of the second variable capacitor 24a such that the amount of change per unit time of the capacitance value of the second variable capacitor 24a becomes equal to or less than a third threshold.

(Plasma Processing Method)

Figure 3:
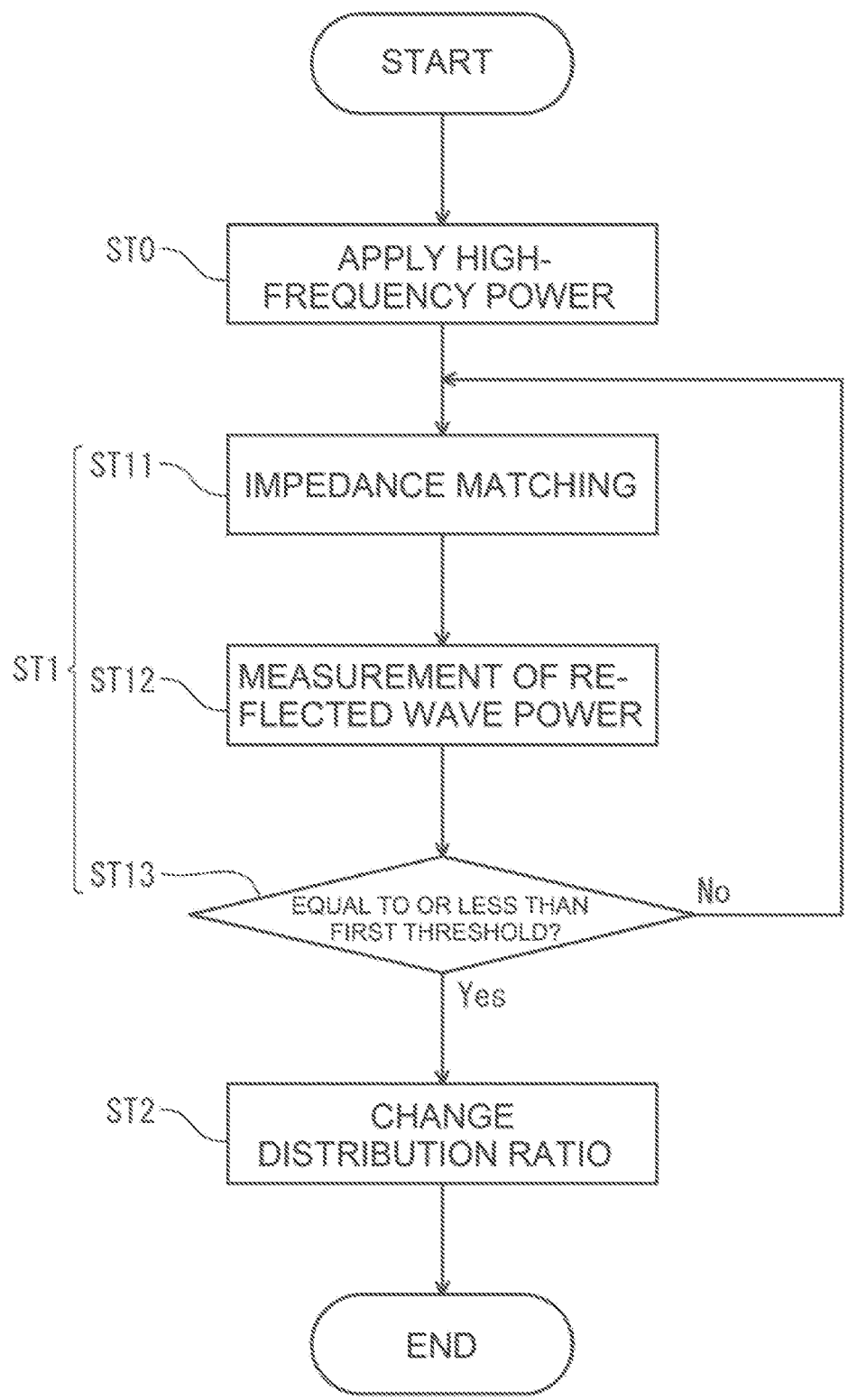
FIG. 3 is a flowchart of a plasma processing method according to Embodiments 1 and 2.
Figure 4:
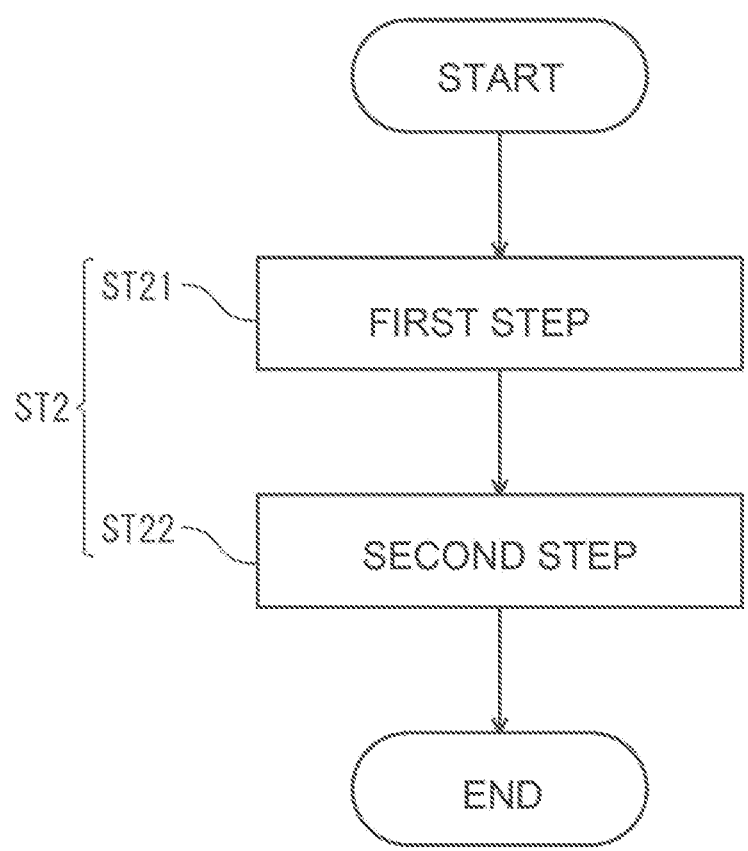
FIG. 4 is a flowchart of a second process in Embodiment 1.
Figure 5:
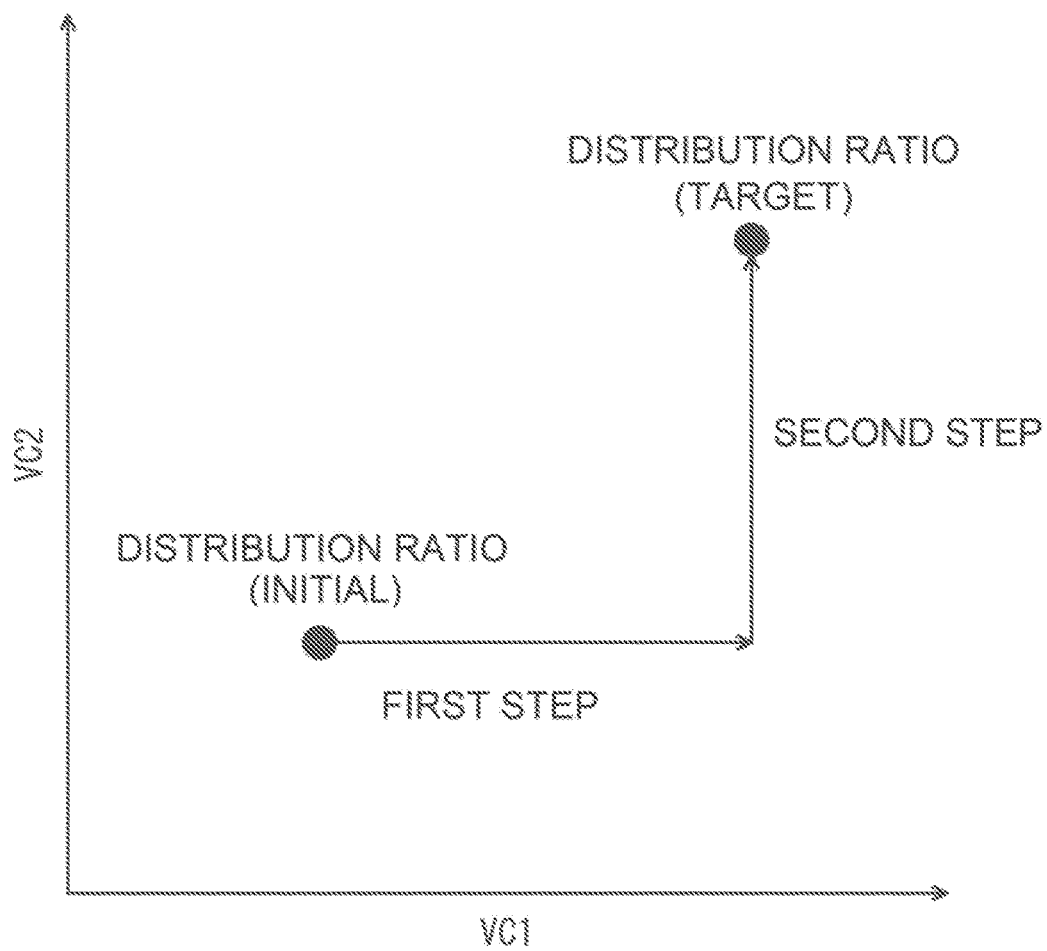
FIG. 5 is a graph showing an example of changes in capacitance value of each variable capacitor in the second process in Embodiment 1.

Next, a plasma processing method using the above-described plasma processing apparatus 10 will be described, with reference to FIGS. 3 to 5. In FIG. 5, the capacitance value of the first variable capacitor 23a is shown as VC1 on the horizontal axis, and the capacitance value of the second variable capacitor 24a is shown as VC2 on the vertical axis. As illustrated in FIG. 3, the plasma processing method includes a power application process ST0, a first process ST1, and a second process ST2.

In the power application process ST0, the high-frequency power source 19 is operated to output a high-frequency power (e.g., AC power of 3 to 30 MHz). Subsequently, the process proceeds to the first process ST1.

The first process ST1 has a matching step ST11, a measuring step ST12, and a judging step ST13. In the matching step ST11, matching of the input impedance to the load impedance is performed by the matcher 21. In the measuring step ST12, the reflected wave power in the matcher 21 is measured by a sensor (not shown). In the judging step ST13, a judgement is made as to whether or not the reflected wave power is equal to or less than the first threshold. If the reflected wave power is equal to or less than the first threshold (Yes, in the judging step ST13), the process proceeds to second step ST2. If the reflected wave power is not equal to or less than the first threshold (No, in the judging step ST13), the process returns to the matching step ST11.

In the second process ST2, the distribution ratio of the high-frequency power distributed between the first coil 17 and the second coil 18 is changed. The second process ST2 has a first step ST21 and a second step ST22 (FIG. 4). In the first step ST21, the capacitance value of the first variable capacitor 23a is changed without the capacitance value of the second variable capacitor 24a changed (the horizontal arrow in FIG. 5). In the second step ST22, the capacitance value of the second variable capacitor 24a is changed without the capacitance value of the first variable capacitor 23a changed (the vertical arrow in FIG. 5).

In the circuit configuration illustrated in FIG. 2, when the capacitance value of the first variable capacitor 23a is reduced, the ratio of the power supplied to the second coil 18 increases (the ratio of the power supplied to the first coil 17 decreases), and conversely, when the capacitance value of the first variable capacitor 23a is increased, the ratio of the power supplied to the second coil 18 decreases (the ratio of the power supplied to the first coil 17 increases). Likewise, when the capacitance value of the second variable capacitor 24a is reduced, the ratio of the power supplied to the second coil 18 increases (the ratio of the power supplied to the first coil 17 decreases), and conversely, when the capacitance value of the second variable capacitor 24a is increased, the ratio of the power supplied to the second coil 18 decreases (the ratio of the power supplied to the first coil 17 increases). In the second process ST2, the distribution ratio of the high-frequency power distributed between the first coil 17 and the second coil 18 can be controlled by using these relationships. For example, when it is desired to increase the ratio of the power supplied to the second coil 18, it can be achieved by reducing the capacitance value of the first variable capacitor 23a first (first step ST21), to make a judgement as to whether or not the desired distribution ratio has been achieved, and if not, then further reducing the capacitance value of the second variable capacitor 24a (second step ST22).

In the second process ST2, the distribution ratio is changed such that the amount of change per unit time of the impedance at downstream of the matcher 21 becomes equal to or less than the fourth threshold. As a specific example, in the first step ST21, the capacitance value of the first variable capacitor 23a is changed such that the amount of change per unit time of the capacitance value of the first variable capacitor 23a becomes equal to or less than the second threshold value, and in the second step ST22, the capacitance value of the second variable capacitor 24a is changed such that the amount of change per unit time of the capacitance value of the second variable capacitor 24a becomes equal to or less than the third threshold.

Embodiment 2

Embodiment 2 of the present disclosure will be described. The plasma processing apparatus 10 of the present embodiment differs from that of Embodiment 1 in the mode of controlling the distribution ratio. In the following, the difference from Embodiment 1 will be mainly described.

Figure 6:
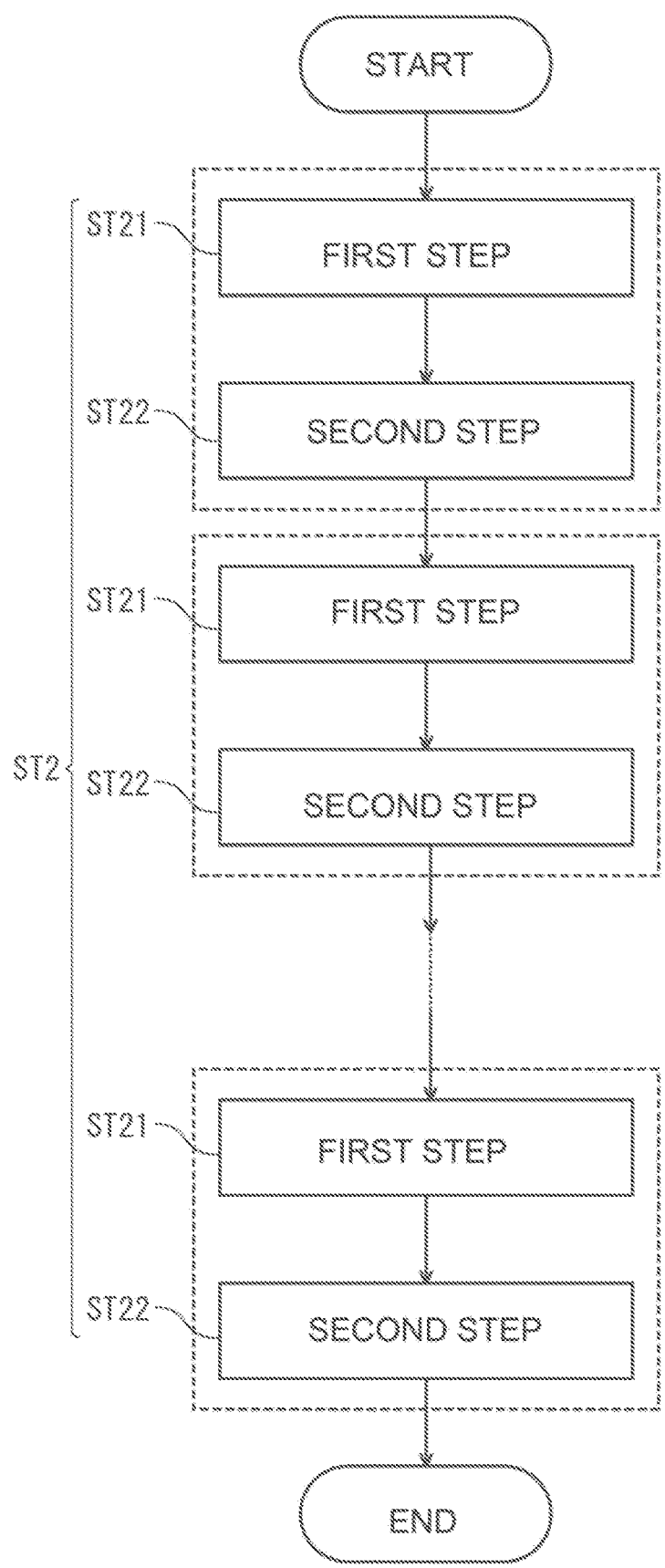
FIG. 6 is a flowchart of a second process in Embodiment 2.
Figure 7:
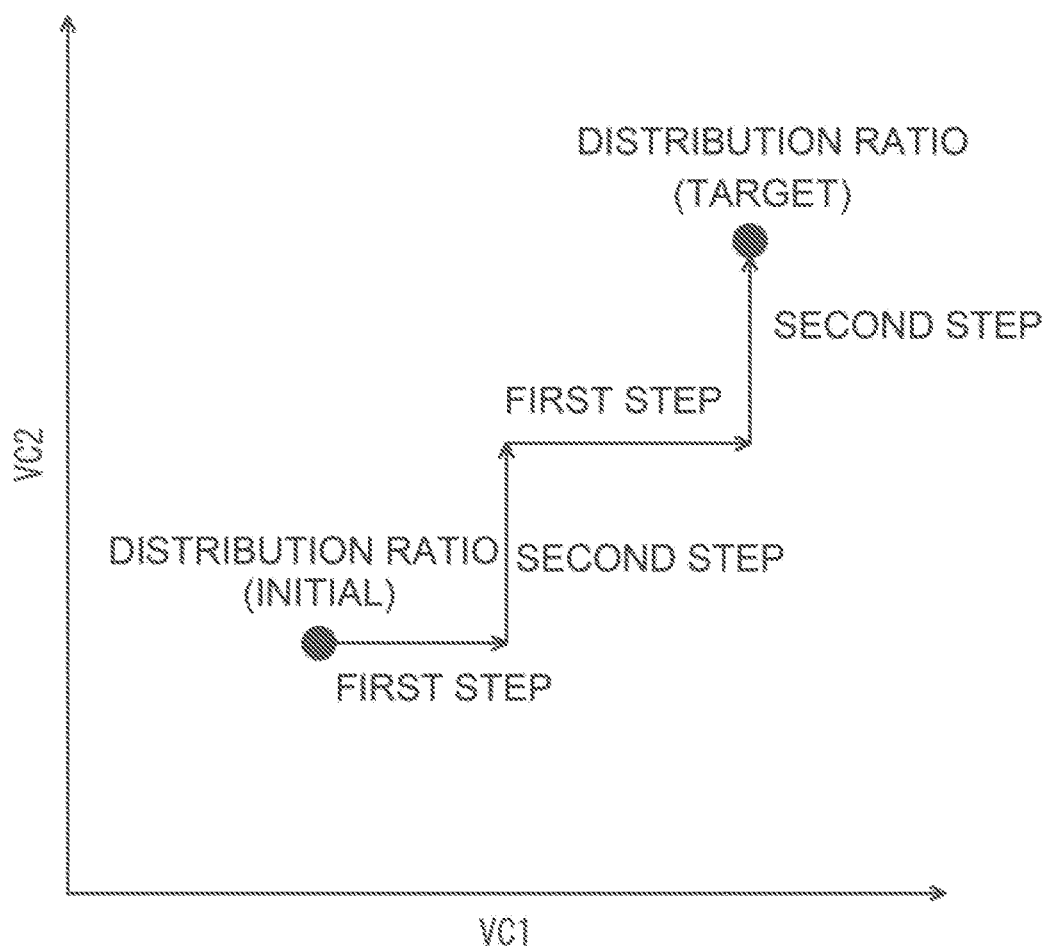
FIG. 7 is a graph showing an example of changes in capacitance value of each variable capacitor in the second process in Embodiment 2.

The control unit 35 changes the distribution ratio by performing the first step ST21 and the second step ST22 a plurality of times. Therefore, in the plasma processing method using the plasma processing apparatus 10 of the present embodiment, as illustrated in FIGS. 6 and 7, the second process ST2 includes a plurality of (two, in this example) first steps ST21, and a plurality of (two, in this example) second steps ST22. That is, in the second process ST2 of the plasma processing method of the present embodiment, the first step ST21 and the second step ST22 are alternately performed a plurality of times.

Embodiment 3

Figure 8:
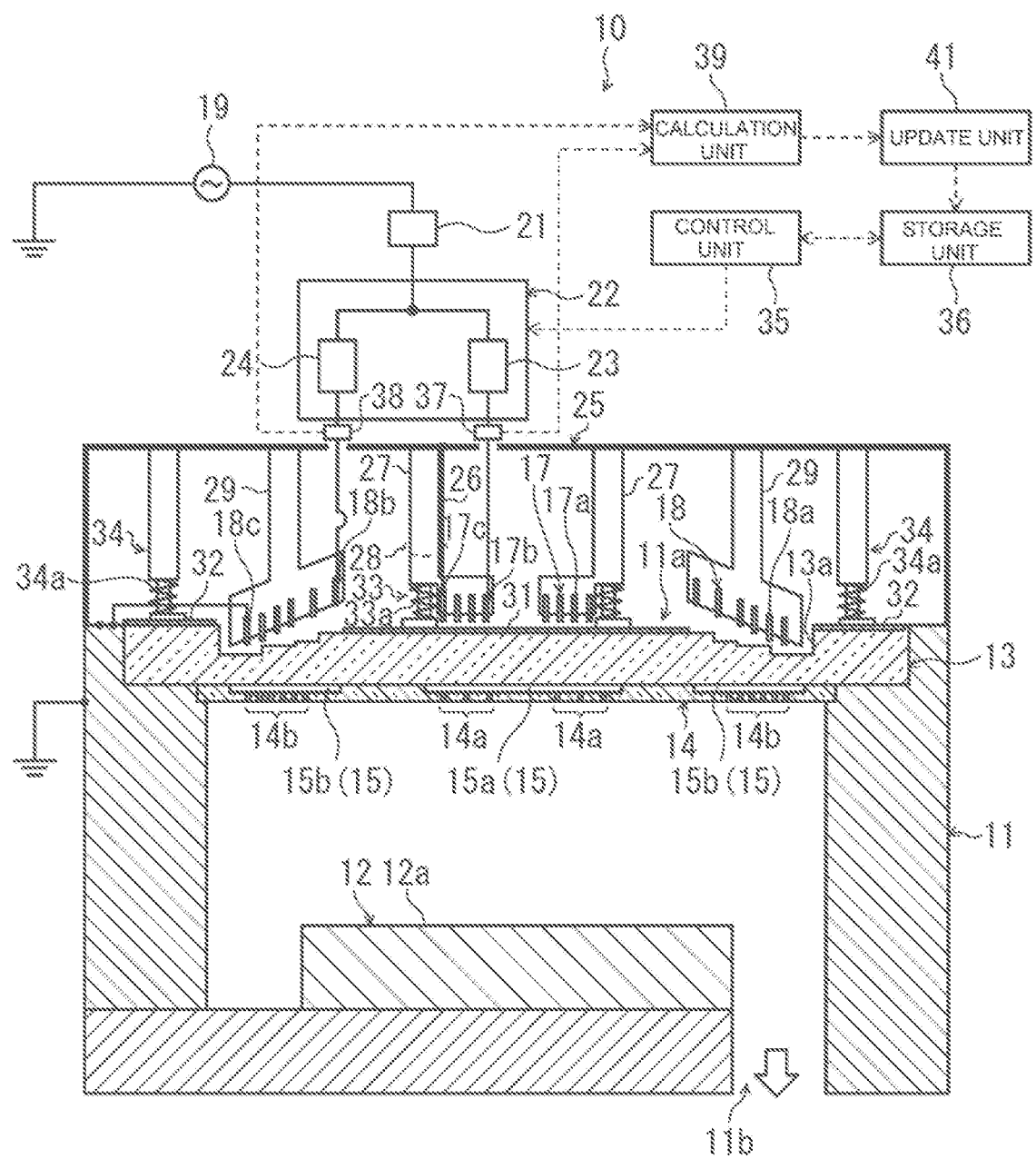
FIG. 8 is a schematic cross-sectional view of a plasma processing apparatus according to Embodiment 3.
Figure 9:
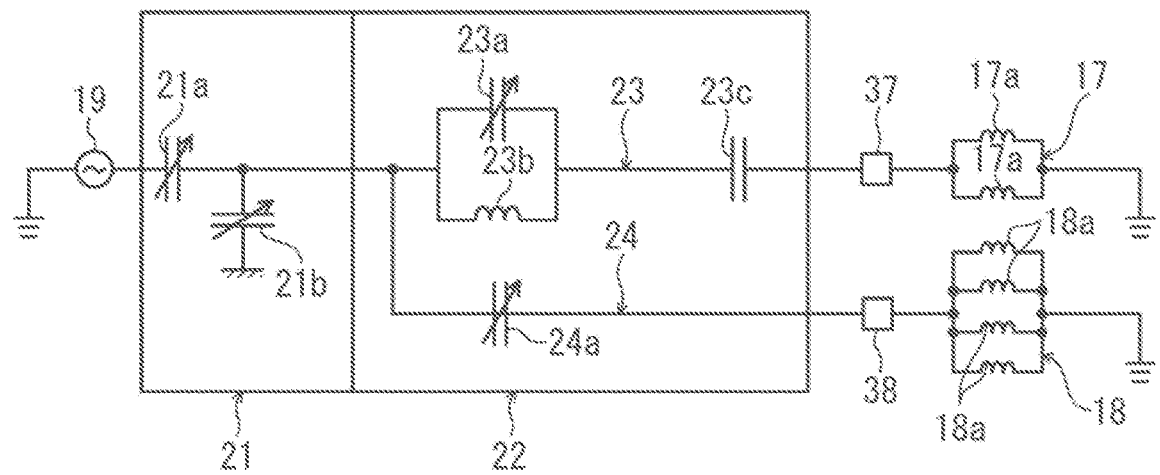
FIG. 9 is a schematic circuit diagram showing a configuration from a high-frequency power source to first and second coils.

Embodiment 3 of the present disclosure will be described. The plasma processing apparatus 10 of the present embodiment is for performing plasma processing on an object to be processed (e.g., a semiconductor substrate). The plasma processing apparatus 10 of the present embodiment is a plasma dicer, but is not limited thereto. As illustrated in FIGS. 8 and 9, the plasma processing apparatus 10 includes a chamber 11, a stage 12, a dielectric member 13, a cover 14, a gas introduction path 15, a first coil 17 and a second coil 18, a metal cover 25, a first support post 27, a second support post 29, a first heater 31 and a second heater 32, a first pressing part 33 and a second pressing part 34, a high-frequency power source 19, a matcher 21, a distributor 22, a control unit 35, a storage unit 36, a first sensor 37 and a second sensor 38, a calculation unit 39, and an update unit 41.

The chamber 11 may be similar to that in the above Embodiment 1.

The stage 12 may be similar to that in the above Embodiment 1.

The dielectric member 13 may be similar to that in the above Embodiment 1.

The cover 14 may be similar to that in the above Embodiment 1.

The gas introduction path 15 may be similar to that in the above Embodiment 1.

The first coil 17 and the second coil 18 may be similar to those in the above Embodiment 1.

The metal cover 25 may be similar to that in the above Embodiment 1.

The first support post 27 may be similar to that in the above Embodiment 1.

The second support post 29 may be similar to that in the above Embodiment 1.

The first heater 31 and the second heater 32 may be similar to those in the above Embodiment 1.

The first pressing part 33 and the second pressing part 34 may be similar to those in the above Embodiment 1.

The high-frequency power source 19 may be similar to that in the above Embodiment 1.

The matcher 21 may be similar to that in the above Embodiment 1.

The distributor 22 may be similar to that in the above Embodiment 1.

The control unit 35 controls the distribution ratio of the high-frequency power distributed between the first coil 17 and the second coil 18. The control unit 35 controls the distribution ratio through controlling of the distributor 22, specifically through adjusting of the capacitance values of the first and second variable capacitors 23a and 24a included in the distributor 22. The control unit 35 controls the distribution ratio of the high-frequency power distributed between the first and second coils 17 and 18, based on a distribution ratio information indicating the relationship between the distribution ratio and the capacitance values of the first and second variable capacitors 23a and 24a.

In the circuit configuration as illustrated in FIG. 9, the control unit 35 may increase the ratio of the power supplied to the second coil 18 (or decrease the ratio of the power supplied to the first coil 17) by either reducing the capacitance value of the first variable capacitor 23a or reducing the capacitance value of the second variable capacitor 24a, or both. The control unit 35 may decrease the ratio of the power supplied to the second coil 18 (or increase the ratio of the power supplied to the first coil 17) by either increasing the capacitance value of the first variable capacitor 23a or increasing the capacitance value of the second variable capacitor 24a, or both.

The storage unit 36 stores the distribution ratio information. The storage unit 36 may be constituted of, for example, a non-volatile memory. The storage unit 36 can be communicated, by wire or wirelessly, with the control unit 35 and the update unit 41.

The first sensor 37 measures the high-frequency power outputted to the first coil 17. The first sensor 37 is disposed between the distributor 22 and the first coil 17. The first sensor 37 may be of any type, and may be any sensor that can measure a high-frequency power. For example, the first sensor 37 may be configured to measure the current and voltage supplied to first coil 17.

The second sensor 38 measures the high-frequency power outputted to the second coil 18. The second sensor 38 is disposed between the distributor 22 and the second coil 18. The second sensor 38 may be of any type, and may be any sensor that can measure a high-frequency power. For example, the second sensor 38 may be configured to measure the current and voltage supplied to second coil 18.

The calculation unit 39 calculates the actual distribution ratio, based on the measured values of the first sensor 37 and the second sensor 38 (i.e., the ratio between the measured values of the high-frequency power at the first coil 17 and at the second coil 18). The calculation unit 39 sends an information on the calculated actual distribution ratio to the update unit 41.

The update unit 41 updates the distribution ratio information stored in the storage unit 36, based on the high-frequency powers outputted to the first coil 17 and the second coil 18. Specifically, the update unit 41 updates the distribution ratio information, based on the actual distribution ratio calculated by the calculation unit 39 and on the capacitance values of the first and second variable capacitors 23a and 24a when the measured values corresponding to the actual distribution ratio are measured. For example, the update unit 41 updates the distribution ratio information at the time when the difference between the actual distribution ratio corresponding to randomly selected capacitance values of the first and second variable capacitors 23a and 24a, and the distribution ratio in the distribution ratio information before updating corresponding to the randomly selected capacitance values exceeds a fifth threshold. At this time, the update unit 41 may update the distribution ratio information by rewriting the information on the distribution ratio in the distribution ratio information before updating, to an information on the actual distribution ratio corresponding to the randomly selected capacitance values.

(Plasma Processing Method)

Figure 10:
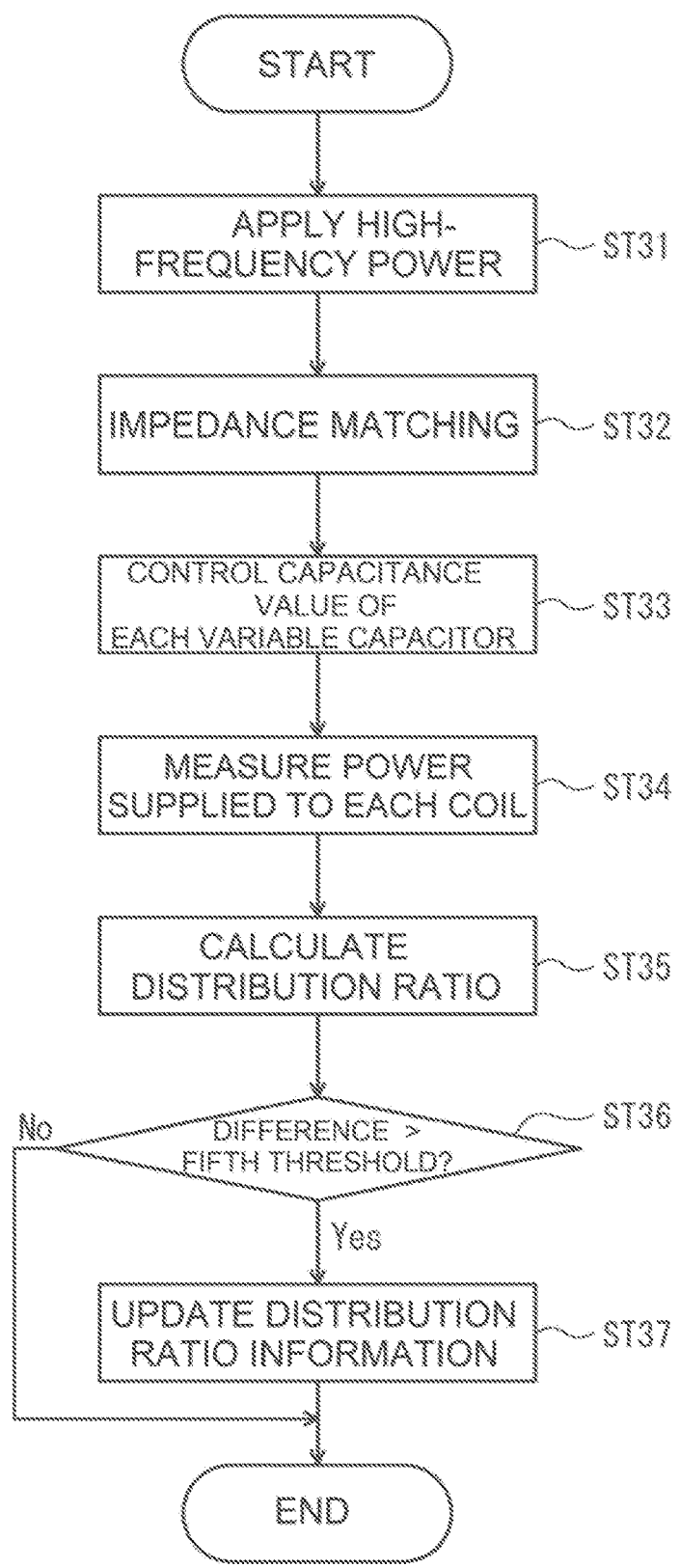
FIG. 10 is a flowchart of a plasma processing method according to Embodiment 3.

Next, a plasma processing method using the above-describe plasma processing apparatus 10 will be described, with reference to FIG. 10. As illustrated in the figure, the plasma processing method includes a power applying step ST31, a matching step ST32, a controlling step ST33, a measuring step ST34, a calculating step ST35, a judging step ST36, and an updating step ST37.

In the power applying step ST31, the high-frequency power source 19 is operated to output a high-frequency power (e.g., AC power of 3 to 30 MHz). Subsequently, the process proceeds to the matching step ST32.

In the matching step ST32, matching of the input impedance to the load impedance is performed by the matcher 21. Subsequently, the process proceeds to the controlling step ST33.

In the controlling step ST33, the distribution ratio is controlled by adjusting the capacitance value of at least one of the first variable capacitor 23a and the second variable capacitor 24a, based on the current distribution ratio information. The controlling step ST33 is an example of the third process. Subsequently, the process proceeds to the measuring step ST34.

In the measuring step ST34, the high-frequency powers outputted to the first coil 17 and the second coil 18 are measured. The measuring step ST34 is an example of the fifth process. Subsequently, the process proceeds to the calculating step ST35.

In the calculating step ST35, the actual distribution ratio is calculated, based on the measured values in the measuring step ST34. The calculating step ST35 is an example of the sixth process. Subsequently, the process proceeds to the judging step ST36.

In the judging step ST36, a judgement is made as to whether or not the difference between the actual distribution ratio calculated in the calculating step ST35 and the distribution ratio in the current distribution ratio information corresponding to the current capacitance values of the first and second variable capacitors 23a and 24a (i.e., the capacitance values having been adjusted in the controlling step ST33) is above a fifth threshold. If the difference exceeds the fifth threshold (Yes), the process proceeds to the updating step ST37. If the difference is not above the fifth threshold (No), a series of processes are ended.

In the updating step ST37, the distribution ratio information is updated, based on the high-frequency powers outputted to the first coil 17 and the second coil 18. In the updating step ST37, the distribution ratio information may be updated by rewriting the information on the distribution ratio in the current distribution ratio information, to an information on the actual distribution ratio information corresponding to the current capacitance values. The updating step ST37 is an example of the fourth process.

Although preferred embodiments of the present disclosure have been described, the scope of the disclosure should not be limited by this description. For example, matters recited in two or more claims selected from a plurality of claims in the appended claims may be combined as long as no technical contradiction arises.

The present disclosure is applicable to a plasma processing apparatus and a plasma processing method.

REFERENCE NUMERALS

10: plasma processing apparatus
  11: chamber
    11a: opening
    11b: exhaust port
  12: stage
    12a: placement surface
  13: dielectric member
  14: cover
    14a: first gas hole
    14b: second gas hole
  15: gas introduction path
    15a: first gas introduction path
    15b: second gas introduction path
  17: first coil
    17a: first conductor
    17b: first end
    17c: second end
  18: second coil
    18a: second conductor
    18b: third end
    18c: fourth end
  19: high-frequency power source
  21: matcher
    21a: third variable capacitor
    21b: fourth variable capacitor
  22: distributor
    23: first distributing circuit
      23a: first variable capacitor
      23b: inductor
      23c: capacitor
    24: second distributing circuit
      24a: second variable capacitor
  25: metal cover
  26: conductive member
  27: first support post
  28: fixing member
  29: second support post
  31: first heater
  32: second heater
  33: first pressing part
    33a: first spring
  34: second pressing part
    34a: second spring
  35: control unit
  36: storage unit
  37: first sensor
  38: second sensor
  39: calculation unit
  41: update unit

What is claimed is:

1. A plasma processing apparatus, comprising:
a chamber;
a high-frequency power source configured to supply a high-frequency power for generating plasma in the chamber;
a matcher connected to the high-frequency power source;
a distributor connected to the matcher and configured to distribute and output the high-frequency power supplied from the high-frequency power source;
a first coil and a second coil connected in parallel with each other, on an output side of the distributor; and
a control unit configured to change a distribution ratio of the high-frequency power distributed between the first coil and the second coil, wherein
the control unit changes the distribution ratio after a reflected wave power in the matcher is made equal to or less than a first threshold by the matcher.

2. The plasma processing apparatus according to claim 1, wherein
the distributor has a first variable capacitor and a second variable capacitor, and
the control unit changes the distribution ratio by performing at least one of a first step of changing the capacitance value of the first variable capacitor without changing the capacitance value of the second variable capacitor, and a second step of changing the capacitance value of the second variable capacitor without changing the capacitance value of the first variable capacitor.

3. The plasma processing apparatus according to claim 2, wherein the control unit performs, when changing the distribution ratio, at least one of the first step and the second step a plurality of times.

4. The plasma processing apparatus according to claim 1, wherein
the distributor has a first variable capacitor and a second variable capacitor, and
the control unit changes the distribution ratio by changing the capacitance values of the first variable capacitor and the second variable capacitor, such that an amount of change per unit time of the capacitance value of the first variable capacitor becomes equal to or less than a second threshold, and an amount of change per unit time of the capacitance value of the second variable capacitor becomes equal to or less than a third threshold.

5. The plasma processing apparatus according to claim 1, wherein the control unit changes the distribution ratio such that an amount of change per unit time of an impedance at downstream of the matcher becomes equal to or less than a fourth threshold.

6. A plasma processing method using a plasma processing apparatus including
a chamber,
a high-frequency power source configured to supply a high-frequency power for generating plasma in the chamber, a matcher connected to the high-frequency power source,
a distributor connected to the matcher and configured to distribute and output the high-frequency power supplied from the high-frequency power source, and
a first coil and a second coil connected in parallel with each other, on an output side of the distributor, the method comprising:
a first process of making a reflected wave power in the matcher to be equal to or less than a first threshold by the matcher; and
a second process of, after the first process, changing a distribution ratio of the high-frequency power distributed between the first coil and the second coil.

7. The plasma processing method according to claim 6, wherein
the distributor has a first variable capacitor and a second variable capacitor, and
the second process has at least one of a first step of changing the capacitance value of the first variable capacitor without changing the capacitance value of the second variable capacitor, and a second step of changing the capacitance value of the second variable capacitor without changing the capacitance value of the first variable capacitor.

8. The plasma processing method according to claim 7, wherein in the second process, at least one of the first step and the second step is performed a plurality of times.

9. The plasma processing method according to claim 6, wherein
the distributor has a first variable capacitor and a second variable capacitor, and
in the second process, the distribution ratio is changed by changing the capacitance values of the first variable capacitor and the second variable capacitor, such that an amount of change per unit time of the capacitance value of the first variable capacitor becomes equal to or less than a second threshold and an amount of change per unit time of the capacitance value of the second variable capacitor becomes equal to or less than a third threshold.

10. The plasma processing method according to claim 6, wherein in the second process, the distribution ratio is changed such that an amount of change per unit time of an impedance at downstream of the matcher becomes equal to or less than a fourth threshold.

11. A plasma processing apparatus, comprising:
a chamber;
a high-frequency power source configured to supply a high-frequency power for generating plasma in the chamber;
a matcher connected to the high-frequency power source;
a distributor connected to the matcher and having a first variable capacitor and a second variable capacitor, and configured to distribute and output the high-frequency power supplied from the high-frequency power source;
a first coil and a second coil connected in parallel with each other, on an output side of the distributor;
a control unit configured to control a distribution ratio of the high-frequency power distributed between the first coil and the second coil, based on a distribution ratio information indicating a relationship between the distribution ratio and the capacitance values of the first variable capacitor and the second variable capacitor, by adjusting at least one of the capacitance values of the first variable capacitor and the second variable capacitor; and an update unit configured to update the distribution ratio information, based on the high-frequency powers outputted to the first coil and the second coil.

12. The plasma processing apparatus of claim 11, further comprising:
a first sensor for measuring a high-frequency power outputted to the first coil;
a second sensor for measuring a high-frequency power outputted to the second coil; and
a calculation unit for calculating an actual distribution ratio, based on the measured values of the first sensor and the second sensor; wherein
the update unit updates the distribution ratio information, based on the actual distribution ratio and on the capacitance values of the first variable capacitor and the second variable capacitor when the measured values corresponding to the actual distribution ratio are measured.

13. The plasma processing apparatus according to claim 12, wherein the update unit updates the distribution ratio information at the time when a difference between the actual distribution ratio corresponding to randomly selected capacitance values of the first variable capacitor and the second variable capacitor, and the distribution ratio in the distribution ratio information before updating corresponding to the randomly selected capacitance values exceeds a fifth threshold.

14. The plasma processing apparatus according to claim 11, further comprising a storage unit for storing the distribution ratio information.

15. A plasma processing method using a plasma processing apparatus including
a chamber,
a high-frequency power source configured to supply a high-frequency power for generating plasma in the chamber,
a matcher connected to the high-frequency power source,
a distributor connected to the matcher and having a first variable capacitor and a second variable capacitor, and configured to distribute and output the high-frequency power supplied from the high-frequency power source, and
a first coil and a second coil connected in parallel with each other, on an output side of the distributor, the method comprising:
a third process of controlling a distribution ratio of the high-frequency power distributed between the first coil and the second coil, based on a distribution ratio information indicating a relationship between the distribution ratio and the capacitance values of the first variable capacitor and the second variable capacitor, by adjusting at least one of the capacitance values of the first variable capacitor and the second variable capacitor; and
a fourth process of updating the distribution ratio information, based on the high-frequency powers outputted to the first coil and the second coil.

16. The plasma processing method according to claim 15, further comprising:
a fifth process of measuring a high-frequency power outputted to each of the first coil and the second coil; and
a sixth process of calculating an actual distribution ratio, based on the measured values in the fifth process; wherein
in the fourth process, the distribution ratio information is updated, based on the actual distribution ratio and on the capacitance values of the first variable capacitor and the second variable capacitor when the measured values corresponding to the actual distribution ratio are measured.

17. The plasma processing method according to claim 16, wherein in the fourth step, the distribution ratio information is updated at the time when a difference between the actual distribution ratio corresponding to randomly selected capacitance values of the first variable capacitor and the second variable capacitor, and the distribution ratio in the distribution ratio information before updating corresponding to the randomly selected capacitance values exceeds a fifth threshold.

* * * * *